(12) United States Patent
Joe et al.

(10) Patent No.: US 11,984,520 B2
(45) Date of Patent: May 14, 2024

(54) LIGHT ABSORPTION STRUCTURE AND LIGHT SENSING DEVICE HAVING THE SAME

(71) Applicant: Samsung Electronics Co., Ltd., Suwon-si (KR)

(72) Inventors: Insung Joe, Seoul (KR); Jonghwa Shin, Daejeon (KR); Joonkyo Jung, Daejeon (KR); Jong Uk Kim, Hwaseong-si (KR)

(73) Assignees: Samsung Electronics Co., Ltd., Gyeonggi-do (KR); Korea Advanced Institute of Science and Technology, Daejeon (KR)

( * ) Notice: Subject to any disclaimer, the term of this patent is extended or adjusted under 35 U.S.C. 154(b) by 68 days.

(21) Appl. No.: 17/671,697

(22) Filed: Feb. 15, 2022

(65) Prior Publication Data
US 2022/0384666 A1    Dec. 1, 2022

(30) Foreign Application Priority Data

May 27, 2021   (KR) .................. 10-2021-0068627
Aug. 11, 2021   (KR) .................. 10-2021-0105860

(51) Int. Cl.
*H01L 31/0232* (2014.01)
*H01L 31/102* (2006.01)

(52) U.S. Cl.
CPC ...... *H01L 31/02327* (2013.01); *H01L 31/102* (2013.01)

(58) Field of Classification Search
CPC ............ H01L 31/02327; H01L 31/102; H01L 31/035281; H01L 31/105; H01L 31/02165; H01L 27/14629; H01L 27/14643; H01L 27/14625; H01L 27/1462; G02B 5/208
See application file for complete search history.

(56) References Cited

U.S. PATENT DOCUMENTS 9,537,027 B2   1/2017   Lu et al.
10,535,701 B2   1/2020   Zhang et al.
10,804,307 B2   10/2020   Cheng et al.
(Continued)

FOREIGN PATENT DOCUMENTS

WO   WO-2017/112747 A1   6/2017

OTHER PUBLICATIONS

Extended European Search Report dated Nov. 8, 2022 in European Application No. 22175928.5.
(Continued)

*Primary Examiner* — Calvin Y Choi
(74) *Attorney, Agent, or Firm* — Harness, Dickey & Pierce, P.L.C.

(57) ABSTRACT

A light sensing device includes a semiconductor layer including a distributed Bragg reflector including a first surface of the semiconductor layer, and a photoelectric conversion unit including a second surface of the semiconductor layer, and the distributed Bragg reflector has a plurality of holes each having, in a cross-sectional view, a width gradually changing from a first width to a second width according to a width change period; a first electrode in one region of the semiconductor layer; and a second electrode on the second surface of the semiconductor layer and having a reflective metal.

20 Claims, 18 Drawing Sheets

(56) References Cited

U.S. PATENT DOCUMENTS

| | | |
|---|---|---|
| 10,818,807 B2 | 10/2020 | Jacob et al. |
| 2009/0303487 A1 | 12/2009 | Bond et al. |
| 2019/0244992 A1* | 8/2019 | Yokogawa ........ H01L 27/14612 |
| 2019/0355775 A1 | 11/2019 | Yamashita |
| 2020/0227460 A1 | 7/2020 | Huang et al. |
| 2021/0048594 A1* | 2/2021 | Singer ................ H01S 5/02253 |

OTHER PUBLICATIONS

Kruger et al., "Color-sensitive photodetector based on porous silicon superlattices," Thin Solid Films, vol. 297, No. 1-2, pp. 241-244, Apr. 1, 1997.

Torres-Costa et al., "All-silicon color-sensitive photodetectors in the visible," Materials Science and Engineering C.. Elsevier Science S.A. CH, vol. 27, No. 5-8, Aug. 8, 2007 pp. 954-956.

Abel Santos et al., "Electrochemical Etching Methods for Producing Porous Silicon," In: "Springer Series in Materials Science", vol. 220, pp. 1-36, Jan. 1, 2015.

* cited by examiner

LIGHT ABSORPTION STRUCTURE AND LIGHT SENSING DEVICE HAVING THE SAME

CROSS TO REFERENCE TO RELATED APPLICATION(S)

This application claims benefit of priority to Korean Patent Application No. 10-2021-0068627 filed on May 27, 2021 and Korean Patent Application No. 10-2021-0105860 filed on Aug. 11, 2021 in the Korean Intellectual Property Office, the disclosures of which are incorporated herein by reference in their entirety.

BACKGROUND

Example embodiments of the present disclosure relate to a light absorption structure and a light sensing device having the same.

Sensing devices for long-wavelength light, such as near-infrared (NIR) wavelength light, have been widely applied to cameras (e.g., for defense and security), cameras for aircraft and satellites (e.g., for monitoring forests/climate), and sensors (e.g., for imaging medicine), and have been newly applied to a facial recognition module for mobile devices, and sensors for autonomous vehicles.

However, a general semiconductor material (e.g., silicon) for a light sensing device may have a low absorbance for light in a long wavelength band, such as a near-infrared wavelength. Accordingly, to compensate for the low absorbance, a thickness of the device may be increased for sufficient absorbance, and/or other materials (and/or additional materials) may need to be added. However, such additions may be difficult to implement with (and/or not be compatible with) general semiconductor processing operations.

SUMMARY

Some example embodiments of the present disclosure are to provide a light absorption structure having a high light absorbance of long-wavelength light (e.g., near-infrared (NIR) rays and/or short wavelength infrared (SWIR) rays).

Some example embodiments of the present disclosure are to provide a light sensing device having a light absorption structure having a high light absorbance of long-wavelength light.

According to an example embodiment of the present disclosure, a resonator-based light absorption structure includes a first semiconductor layer configured to be an optical cavity of the resonator; a distributed Bragg reflector layer including a plurality of holes on a first surface of the first semiconductor layer, each of the plurality of holes having, in a cross-sectional view, a width gradually changing from a first width to a second width according to a width change period; and a reflective layer on a second surface of the first semiconductor layer, the second surface of the first semiconductor layer opposite to the first surface of the first semiconductor layer.

According to an example embodiment of the present disclosure, a light sensing device includes a semiconductor layer including a distributed Bragg reflector including a first surface of the semiconductor layer, and a photoelectric conversion unit including a second surface of the semiconductor layer, and the distributed Bragg reflector has a plurality of holes each having, in a cross-sectional view, a width gradually changing from a first width to a second width according to a width change period; a first electrode in one region of the semiconductor layer; and a second electrode on the second surface of the semiconductor layer and having a reflective metal.

According to an example embodiment of the present disclosure, a light sensing device includes a semiconductor layer including a distributed Bragg reflector including a first surface of the semiconductor layer and a photoelectric conversion unit including a second surface of the semiconductor layer, and the distributed Bragg reflector has a plurality of holes each having, in a cross-sectional view, a width gradually changing from a first width to a second width according to a width change period; a first electrode in one region of the semiconductor layer; a second electrode on the second surface of the semiconductor layer and having a reflective metal; and a logic substrate including a logic circuit, the logic substrate on the second surface of the semiconductor layer and electrically connected to the first and second electrodes, the logic circuit configured to process a signal output by the photoelectric conversion unit.

According to an example embodiment of the present disclosure, a resonator-based light absorption structure includes a semiconductor layer configured to be an optical cavity of the resonator; a distributed Bragg reflector structure including a plurality of posts, comprising a semiconductor material, on a first surface of the semiconductor layer, each of the plurality of posts having, in a cross-sectional view, a width gradually changing from a first width to a second width according to a width change period; and a reflective layer on a second surface of the semiconductor layer, the second surface of the semiconductor layer opposite to the first surface of the semiconductor layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, some example embodiments of the present disclosure will be described as follows with reference to the accompanying drawings.

Although the terms "first," "second," "third," etc., may be used herein to describe various elements, components, regions, layers, and/or sections, these terms are only used to distinguish one element, component, region, layer, or section, from another region, layer, or section. Thus, a first element, component, region, layer, or section, discussed below may be otherwise termed a second element, component, region, layer, or section, without departing from the scope of this disclosure.

Spatially relative terms, such as "lower," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees or at other orientations) and the spatially relative descriptors used herein interpreted accordingly.

Figure 1:
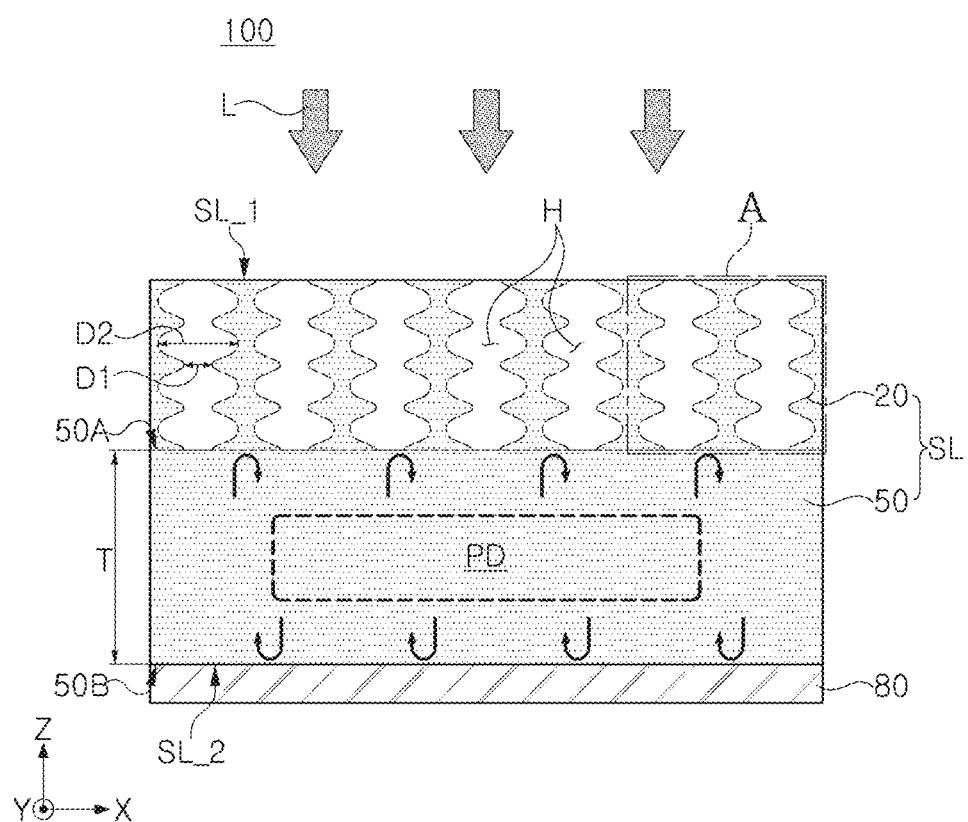
FIG. 1 is a cross-sectional diagram illustrating a resonator-based light absorption structure according to some example embodiments of the present disclosure.
Figure 2:
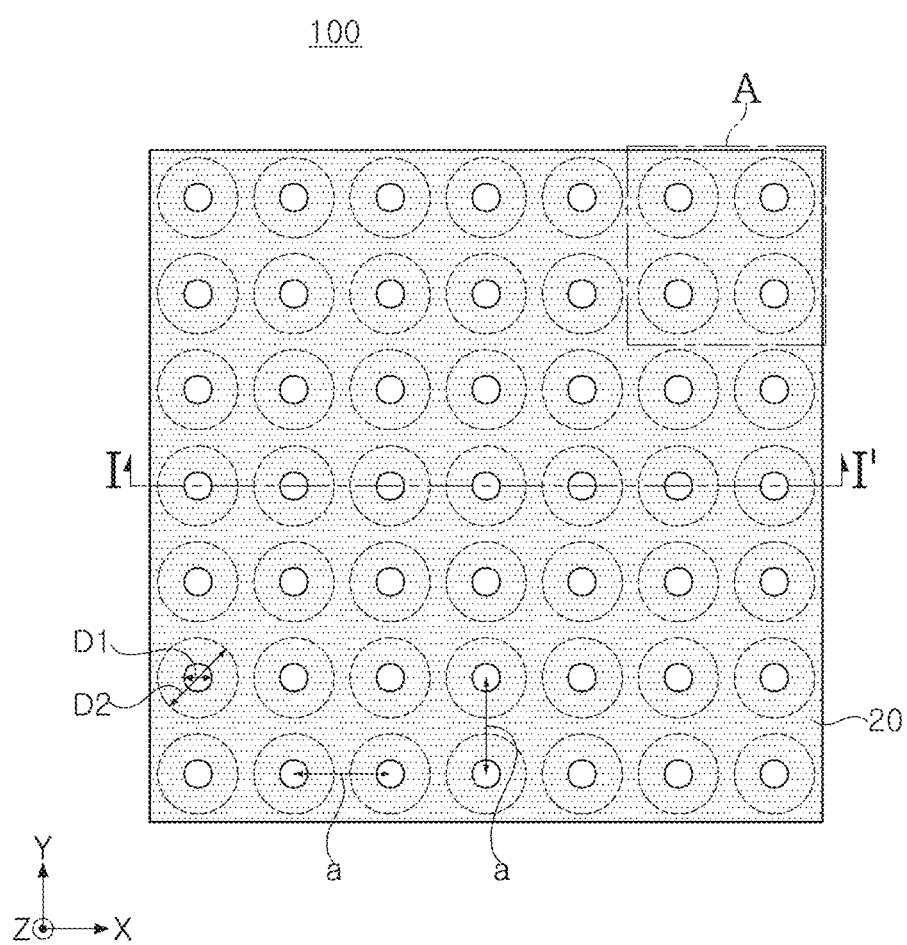
FIG. 2 is a plan diagram illustrating the resonator-based light absorption structure illustrated in FIG. 1.
Figure 3:
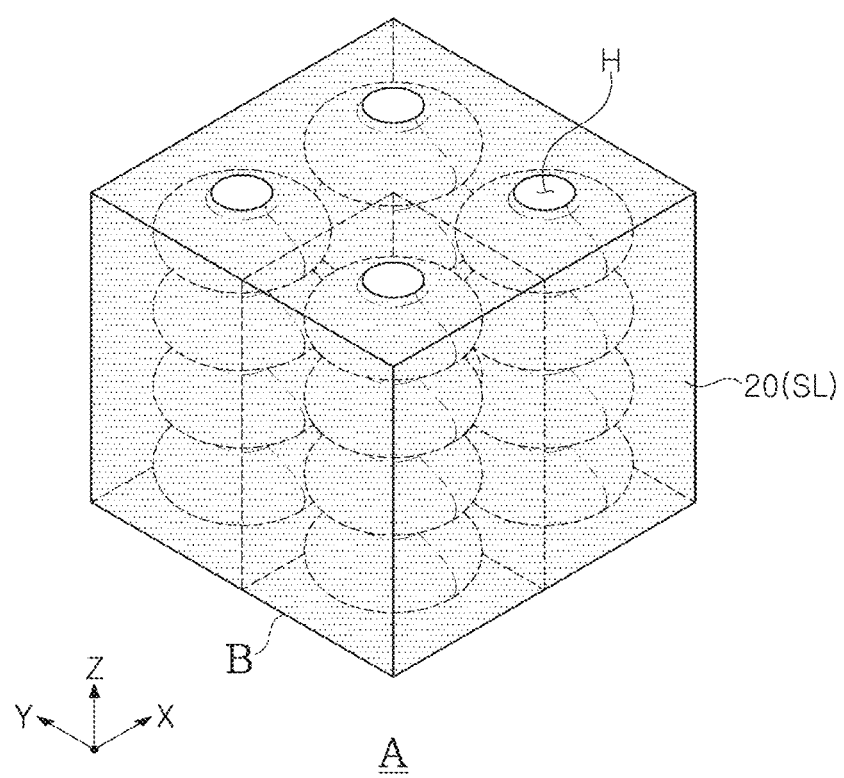
FIG. 3 is a perspective diagram illustrating a portion of a distributed Bragg reflector layer included in FIG. 1.
Figure 4A:
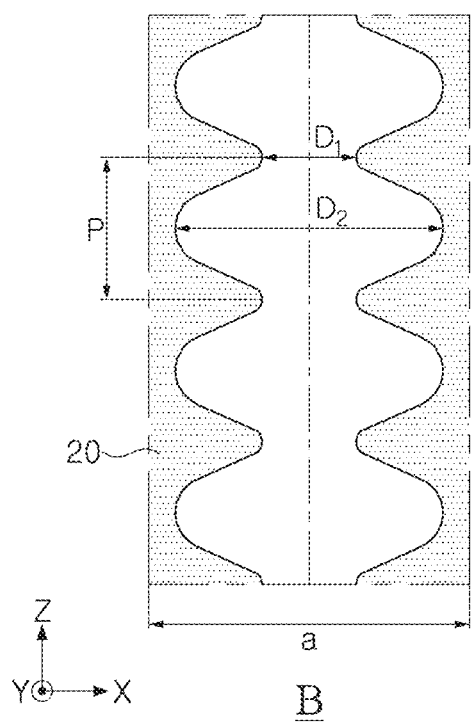
FIG. 4A is a cross-sectional diagram illustrating a hole structure of the distributed Bragg reflector layer illustrated in FIG. 3.
Figure 4B:
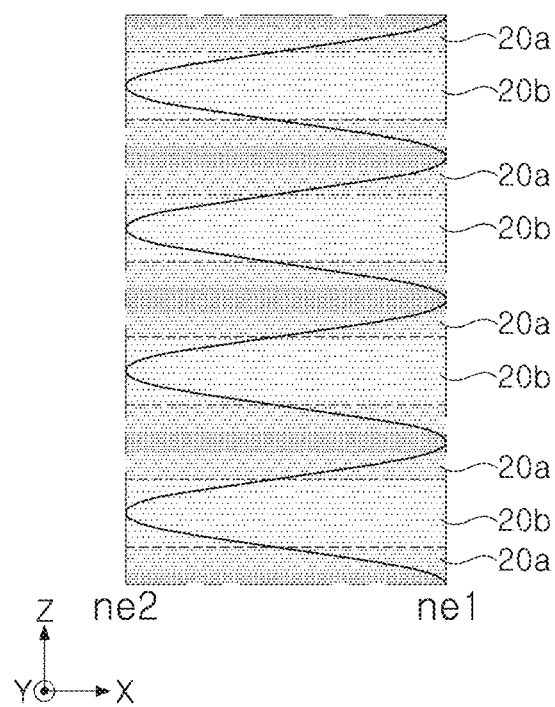
FIG. 4B is a diagram illustrating an effective refractive index distribution by the hole structure included in FIG. 4A.

FIG. 1 is a cross-sectional diagram illustrating a resonator-based light absorption structure according to some example embodiments. FIG. 2 is a plan diagram illustrating the resonator-based light absorption structure illustrated in FIG. 1. FIG. 3 is a perspective diagram illustrating a portion of a distributed Bragg reflector layer included in FIG. 1. FIG. 4A is a cross-sectional diagram illustrating a hole structure of the distributed Bragg reflector layer illustrated in FIG. 3. FIG. 4B is a diagram illustrating an effective refractive index distribution by the hole structure included in FIG. 4B.

Referring to FIGS. 1 and 2, a light absorption structure 100, according to some example embodiment, may have a cavity layer 50 (also referred to as a "first semiconductor layer") having a first surface 50A and a second surface 50B disposed opposite to each other, a distributed Bragg reflector layer 20 (also referred to as a "second semiconductor layer") disposed on the first surface 50A of the cavity layer 50, and a reflective layer 80 disposed on the second side 50B of the cavity layer 50.

Each of the cavity layer 50 and the distributed Bragg reflector layer 20 may be formed of a semiconductor, and may be configured as an upper region and a lower region of a single semiconductor layer SL, respectively. The semiconductor layer SL may include a first surface SL_1 provided by the distributed Bragg reflector layer 20 and a second surface SL_2 provided by the cavity layer 50 The semiconductor layer SL may be configured such that light L incident to the first surface SL_1 and may be incident into the cavity layer 50 through the distributed Bragg reflector layer 20.

In some example embodiments, the distributed Bragg reflector layer 20, may have a plurality of holes H each having a width changing in the thickness direction of the semiconductor layer SL with a predetermined (and/or otherwise determined) period P. As illustrated in FIGS. 3 and 4A, the plurality of holes H may have a width gradually changing from a first width D1 to a second width D2 with the period P.

As for a region of the semiconductor layer SL having a relatively high refractive index (e.g., Si refractive index: about 3.5), adjacent to the first surface SL_1, an effective refraction index may be changed (e.g., in the thickness direction (e.g., Z direction)) by the hole H filled with a low refractive index medium such as air (refractive index: 1).

For example, referring to FIG. 4B, in the region of the semiconductor layer SL adjacent to the first surface SL_1, the region having the first width D1 may have a first effective refractive index $n_{e1}$, whereas the region having the second width D2 (e.g., wherein the second width D2 is greater than the first width D1) may have a second effective refractive index $n_{e2}$ (e.g., wherein second effective refractive index $n_{e2}$ is smaller than the first effective refractive index $n_{e1}$ because the influence of the low refractive index medium is relatively large).

In some example embodiments, since the change from the first width D1 to the second width D2 is gradual, the change in the effective refractive index in the thickness direction (e.g., the Z direction) may be represented by curve changing (e.g., with the period P) between the first effective refractive index $n_{e1}$ and the second effective refractive index $n_{e2}$. Due to the change in the effective refractive index, the region of the semiconductor layer SL adjacent to the first surface SL_1 may be provided as the distributed Bragg reflector layer 20 in which a first layer 20a (which may be a high refractive index region) and a second layer 20b (which may be a low refractive index region) are alternately stacked.

Also, as illustrated in FIG. 2, the holes H may be arranged in the horizontal direction (e.g., the X direction and/or the Y direction) with an arrangement period a. The arrangement period a in the horizontal direction may also be a major parameter for determining the effective refractive index and a reflectance along with the above-described structural parameters.

Hereinafter, a method of adjusting reflection characteristics of the distributed Bragg reflector layer 20 in some example embodiments, using the above-described parameters, will be described in greater detail with reference to FIGS. 5 to 7B.

A general distributed Bragg reflector ("DBR") structure may have a wider photonic band-gap as a difference in refractive indexes between two repeated layers increases, and accordingly, a reflected wavelength band may extend. The term "photonic bandgap" refers to a frequency band which may not be transmitted because a propagating mode performing in a photonic crystal and/or the DBR structure is not present. Similarly, in the distributed Bragg reflector layer 20, the reflected wavelength band may be adjusted using the first width D1 and the second width D2.

Figure 5A:
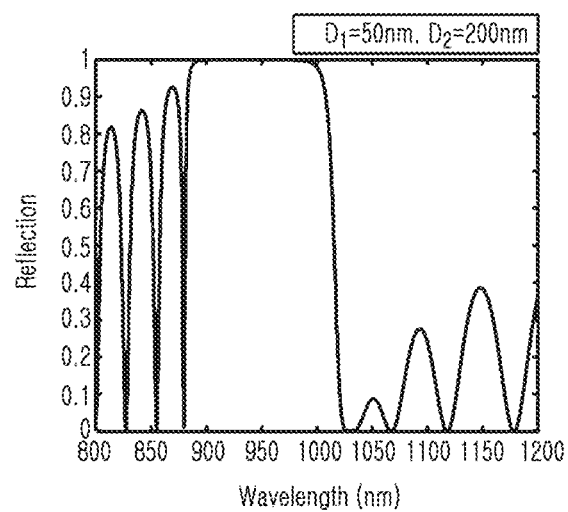
FIGS. 5A and 5B are graphs illustrating changes in reflection characteristics depending on a radius of a hole.
Figure 5B:
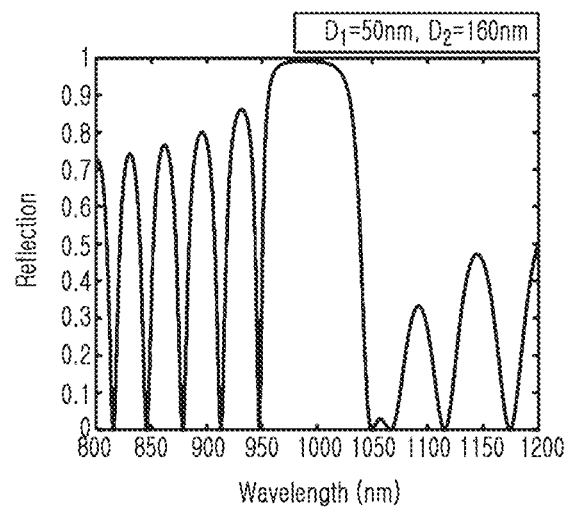

FIGS. 5a and 5b are graphs illustrating results of computational simulation of reflectance according to changes in width of the distributed Bragg reflector layer 20. FIG. 5A illustrates the results under the conditions (Example 1A) in which D1=50 nm and D2=200 nm, and FIG. 5B illustrates the results under the conditions (Example 1B) in which D1=50 nm and D2=160 nm.

Referring to FIGS. 5A and 5B, the result of Example 1A illustrates a tendency in which the reflected wavelength band increases as compared to the result of Example 1B. As such, when the other conditions (e.g., a horizontal period, a vertical period, and the number of repetitions) are constant in the distributed Bragg reflector layer 20, by increasing the difference between the first width D1 and the second width D2, the difference in effective refractive index may increase, and the reflected wavelength band may be also widened.

Also, referring to FIGS. 5A and 5B, changes in the width of a wavelength band and also changes in a central wavelength may be shifted. For example, the central wavelength in Example 1B exhibits a redshift phenomenon in which the wavelength increases to a longer wavelength, as compared to the central wavelength in Example 1A.

In a general DBR structure, the thickness of each layer may be determined by a desired effective refractive index and a target reflection wavelength (e.g., a position of a photonic bandgap). This thickness may have an effect in which a width change period (e.g., thickness) of the effective medium layer (see 20a and 20b in FIG. 4b) may change by the width change period P in the thickness direction (e.g., Z direction) in the distributed Bragg reflector layer 20; accordingly, the central position of the photonic bandgap may be adjusted. In the example embodiment, the term "width change period" is also referred to as "period in the thickness direction (or vertical direction)".

Figure 6A:
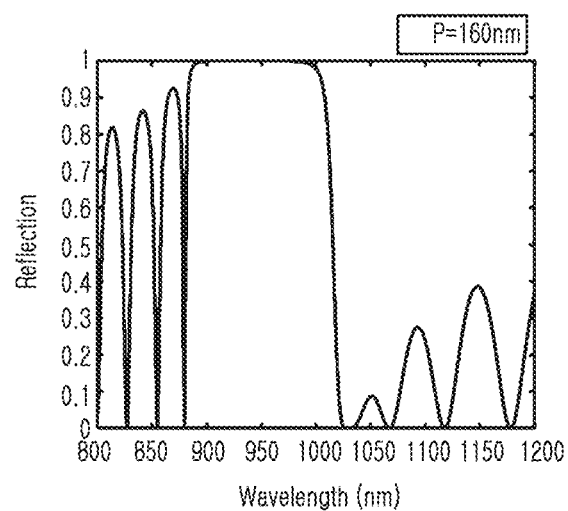
FIGS. 6A and 6B are graphs illustrating changes in reflection characteristics depending on a period in the vertical direction.
Figure 6B:
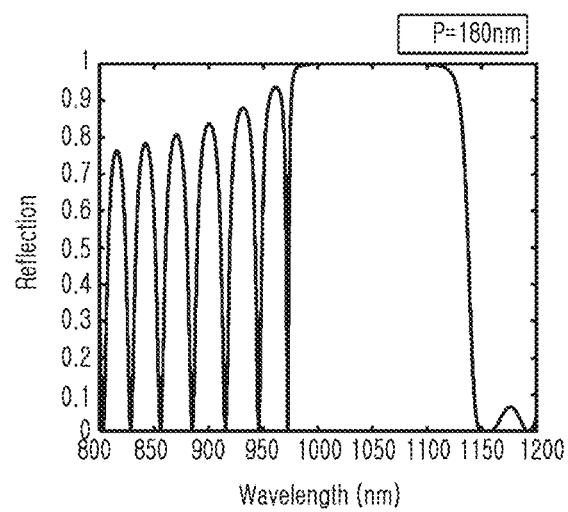

FIGS. 6A and 6B are graphs illustrating a reflectance computational simulation results according to the period of the distributed Bragg reflector layer 20 in the vertical direction. FIG. 6A is a result under the condition (Example 2A) in which P=160 nm, and FIG. 6B is a result under the condition (Example 2B) in which P=180 nm. When the other conditions (e.g., a ratio of width and the number of repetitions) are constant, as the period P in the vertical direction becomes longer, the central wavelength moves toward the longer wavelength, and the wavelength band tends to be widened.

Figure 7A:
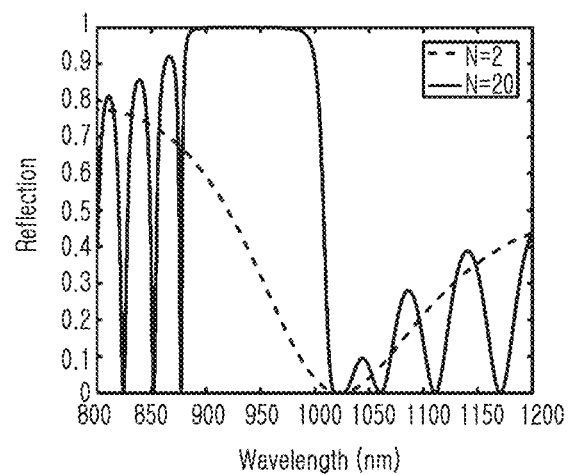
FIGS. 7A and 7B are graphs illustrating changes in reflection characteristics depending on the number of repetitions of a width change period in a vertical direction.
Figure 7B:
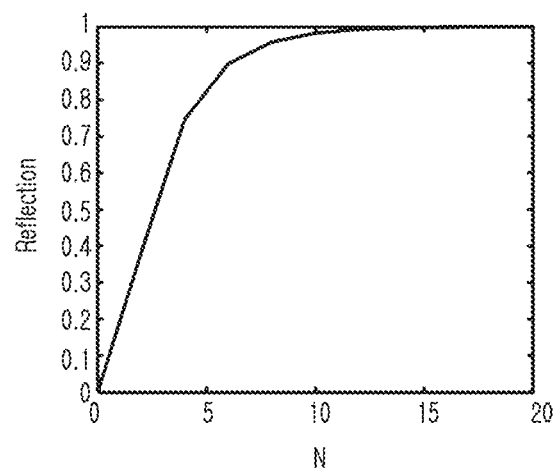

FIGS. 7A and 7B are graphs illustrating results of a reflectance computational simulation according to the number of repetitions N of a period of the distributed Bragg reflector layer 20 in the vertical direction.

Referring to FIG. 7A, when the period is repeated twice, high reflectance characteristics were not clearly exhibited in a specific wavelength band, but when the period is repeated 20 times, a DBR structure having high reflectivity in a specific wavelength band was implemented.

Referring to FIG. 7B, the reflectance in the 940 nm wavelength according to the number of repetitions N is illustrated, and, as the number of repetitions N increases, the reflectance in the 940 nm wavelength gradually increases, and when the number of repetitions is greater than 10 times, almost complete reflectance (e.g., 99% or more) is exhibited similarly to the reflection characteristics of the DBR.

As such, as the number of repetitions N increases, the reflectance of the DBR increases, and as the photonic bandgap size of the DBR increases, sufficient reflectance may be obtained even with a relatively small number of repetitions N.

The resonator-based light absorption structure 100 illustrated in FIG. 1 may implement a region adjacent to an incident surface SL_1 of the semiconductor layer SL, which is a medium having a high refractive index, as a hole-based DBR layer 20, and by introducing a reflective layer 80 having a mirror structure to the opposite surface SL_2 of the semiconductor layer SL, a resonator structure may be obtained. The resonant frequency (and/or the target wavelength λ) may vary depending on the thickness T of the cavity layer 50, and the thickness T of the cavity layer 50 may be designed such that the resonant frequency is disposed in a center of the photonic bandgap of the DBR layer 20. For example, the center of the photonic bandgap of the DBR layer 20 may be a wavelength (the reflectivity of the DBR layer is approximately 1) of light input to the cavity layer 50 through the DBR layer 20, and the thickness T of the cavity layer 50 may be determined such that this wavelength may become the resonant frequency.

In the light absorption structure 100 according to some example embodiments, since the light L incident to the DBR layer is not transmitted to the reflective layer disposed on the second surface, which may be approximated as a single-port resonator structure, the light absorption structure 100 may be analyzed by applying temporal coupled mode theory. In these cases, absorbance "A" of the light absorption structure 100 may be expressed by the equation including resonator parameters as below:

$$A = \frac{4\gamma_a\gamma_r}{(\omega-\omega_0)^2 + (\gamma_a + \gamma_r)^2}$$

In the equation, w is an angular frequency, $\omega_0$ is a resonant angular frequency, $\gamma_a$ and $\gamma_r$ are an intrinsic loss rate and a radiation loss rate of the resonator, respectively.

From the above equation, when light having a frequency (e.g., a target wavelength) corresponding to the resonant frequency of the resonator is incident, and the condition $\gamma_a=\gamma_r$ is satisfied, perfect absorption in which entire incident light is absorbed may occur, which may also be called critical coupling. The case in which the intrinsic loss rate is smaller than the radiation loss rate ($\gamma_a<\gamma_r$) is called "undercoupling," and the case in which the intrinsic loss rate is greater than the radiation loss rate ($\gamma_a>\gamma_r$) is called "overcoupling," and in these cases, perfect absorption is not possible, and only partial absorption is possible depending on the ratio between the two elements.

For example, for silicon an imaginary dielectric constant (κ) related to an intrinsic loss factor is 0.001 level, which is very low, the absorbance for light (e.g., in the near-infrared band) may also be very low. However, when using the "critical coupling" principle described above, complete or almost complete absorption using silicon may be possible even in the near-infrared band.

In the resonator-based light absorption structure 100, a critical coupling condition may be obtained by adjusting the number of repetitions N of the DBR layer such that complete or almost complete absorption using a semiconductor such as silicon may be available even in the target wavelength λ of a long wavelength band such as a near-infrared band.

Figure 8A:
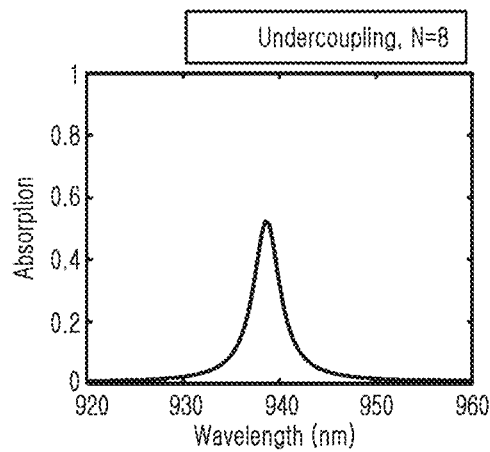
FIGS. 8A to 8C are graphs illustrating changes in absorption performance depending on the number of repetitions of a width change period in a vertical direction.
Figure 8B:
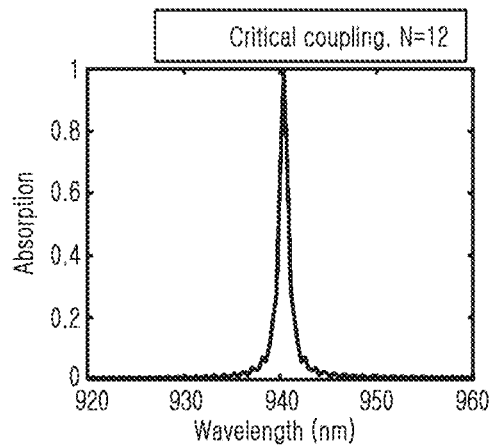
Figure 8C:
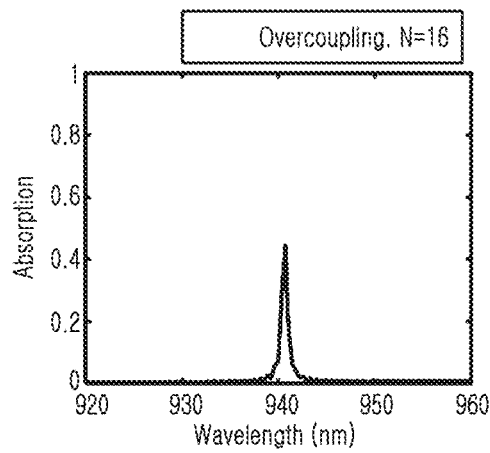

FIGS. 8A to 8C are graphs illustrating changes in absorption performance depending on the number of repetitions of a width change period in a vertical direction. In this computational simulation, the permittivity (κ) was set to 0.001.

FIG. 8A illustrates the absorbance according to the wavelength of the light absorption structure 100 having the DBR layer 20 in which the number of repetitions N of the period in the vertical direction is 2. Undercoupling with a relatively large radiation loss occurs, such that a low absorbance (about 0.5) exhibited at a wavelength of 940 nm. Similarly, FIG. 8C illustrates the absorbance according to the wavelength of the light absorption structure 100 having the DBR layer 20 in which the number of repetitions N of the period in the vertical direction is 16. Overcoupling with a relatively large intrinsic loss rate occurred, such that a low absorbance (about 0.45) exhibited at a wavelength of 940 nm.

Comparatively, FIG. 8B illustrates the absorbance according to the wavelength of the light absorption structure 100 having the DBR layer 20 in which the number of repetitions N of the period in the vertical direction is 12. The critical coupling in which the intrinsic loss rate is almost equal to the radiation loss rate occurred, such that an almost perfect absorption (about 1.0) exhibited at the wavelength of 940 nm.

As such, the DBR layer 20 in which the critical coupling occurs may be formed by adjusting the number of units (e.g., the number of repetitions N) corresponding to a single period P in the vertical direction to be in an appropriate range, and the resonator-based light absorption structure 100 having such the DBR layer 20 may have a complete or almost complete absorbance (99% or more) for a target wavelength.

As the extinction coefficient of the semiconductor layer 50 (which is the medium) increases the reflectance for critical coupling tends to decrease. Accordingly, the number of repetitions N may also decrease.

As described above, as for the DBR layer 20, to implement a resonator for high absorbance (e.g., 99% or more) of a target wavelength, the first width D1 and the second width D2, the period P in the vertical direction, the arrangement period a in the horizontal direction, and the number of repetitions N of the period in the vertical direction may be appropriately designed. The DBR layer 20 in some example embodiments may be designed to have a structure for absorbing light in a near-infrared (NIR) wavelength band, such as, for example, light in a 700 nm-1000 nm band.

Such a design element may vary depending on the target wavelength λ and a complex refractive index of the material forming the semiconductor layer 50. For example, when designing the DBR layer 20 for the light absorption structure 100 in a wavelength of 940 nm (while assuming a complex refractive index (3.48+0.001i), e.g., similar to silicon), the first width D1 may be in the range of 20-800 nm, the second width D2 may be in the range of 100-1000 nm, and the width change period P in the vertical direction may be in the range of 50 nm-600 nm. In some example embodiments, the first width D1 may be in the range of 20-200 nm, the second width D2 may be in the range of 160-300 nm, and the period P in the vertical direction may be in the range of 100 nm-300 nm. Also, the width change period P may be repeated 2 to 30 times, and in example embodiments, the width change period P may be repeated 5 to 20 times.

As described above, the thickness T of the cavity layer 50 for the resonance condition may increase in proportion to the target wavelength λ of the resonator, and may decrease as the refractive index of the material (the semiconductor layer 50) of the resonator increases. In the design conditions of the DBR layer 20 for the light absorption structure 100 in the wavelength of 940 nm described above, the thickness T of the cavity layer 50 may be in the range of 100 nm-500 nm, and in example embodiments, the thickness T of the cavity layer 50 may be in the range of 140 nm-200 nm.

For example, when designing the DBR layer 20 such that the width change period P in the vertical direction is repeated 12 times to induce critical coupling, other than the reflective layer 80, the thickness of the resonator structure, the thickness of the semiconductor layer SL, may be in the range of 2000 nm to 2400 nm (e.g., 2089 nm). As such, the resonator-based light absorption structure 100 may be implemented in an ultra-thin shape.

The effective refractive index of the DBR layer 20 may be determined by adjusting the structural parameters of the first width D1 and the second width D2, the period P in the vertical direction, the arrangement period a in the horizontal direction, and the number of repetitions N of the period in the vertical direction, and the central position of the photonic bandgap (the target wavelength λ) may be determined by an optical path length in consideration of an average value of the effective refractive indexes and the physical distance.

In some example embodiments, the arrangement period a in the horizontal direction may be smaller than the target wavelength λ. Light incident under these conditions may not occur diffraction in a free space. For example, the arrangement period a in the horizontal direction in the DBR layer 20 may be in the range of 100 nm-700 nm, and in example embodiments, the arrangement period a in the horizontal direction may be in a range of 150 nm-400 nm.

The above-described conditions of the materials and parameters of the semiconductor layer have been exemplified as the conditions for the absorption structure for absorbing near-infrared light, and may also be modified to be the light absorption structure for long wavelengths of other bands. In some example embodiments, the resonator-based light absorption structure may be designed as a structure for short-wave infrared light, such as, for example, light in the 1000 nm-3000 nm band. In these cases, as the semiconductor layer for the light absorption structure, a material having a relatively large extinction coefficient may be used with respect to a corresponding wavelength. For example, the semiconductor layer may include at least one of germanium (Ge), silicon germanium (SiGe), gallium arsenide (GaAs), and/or indium gallium arsenide (InGaAs). Also, the DBR layer may have a high reflectance with respect to the target wavelength, and for the critical coupling to occur in the resonator structure, the parameter conditions may be appropriately changed.

The cavity layer 50 may be a portion of the semiconductor layer SL, and may be provided as a region in which light is absorbed. The cavity layer 50 may, for example, be and/or function as an optical cavity for the resonator-based light absorption structure 100.

As illustrated in FIG. 1, the cavity layer 50 may have a photoelectric conversion region PD. The photoelectric conversion region PD may receive light (e.g., near-infrared rays) incident from the DBR layer, and may generate photocharges based on the received light. The photoelectric conversion region PD may be a photodiode including at least one of a P-type impurity region, an N-type impurity region, and/or an intrinsic region (e.g., a low concentration N-type impurity region). In some example embodiments, the photoelectric conversion region PD may include a phototransistor, a photogate, a pinned photodiode, and/or the like, instead of a photodiode.

In the example embodiment, since the cavity layer 50 is implemented as a semiconductor layer, a photoelectric conversion region PD (such as a photodiode) may easily be formed. Also, as described above, light in a target wavelength, such as near-infrared light, may be completely absorbed by the cavity layer 50 in the photoelectric conversion region PD, and the element may be provided as an excellent light sensing device (see FIGS. 15 to 19).

Figure 9A:
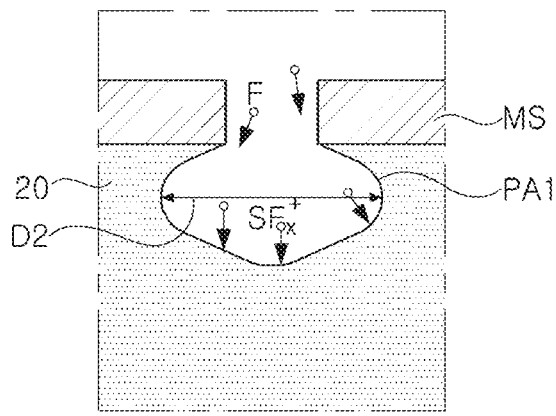
FIGS. 9A to 9C are main cross-sectional diagrams illustrating processes of a method of forming a hole-based distributed Bragg reflector layer.
Figure 9B:
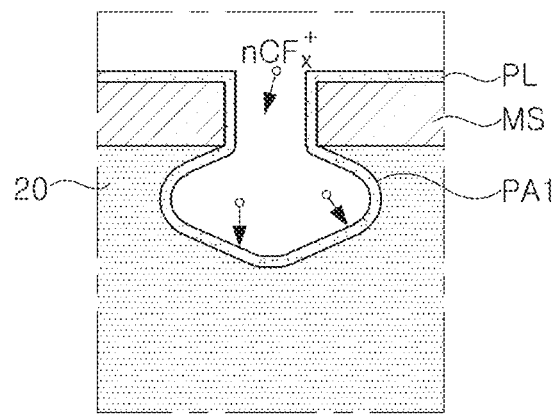
Figure 9C:
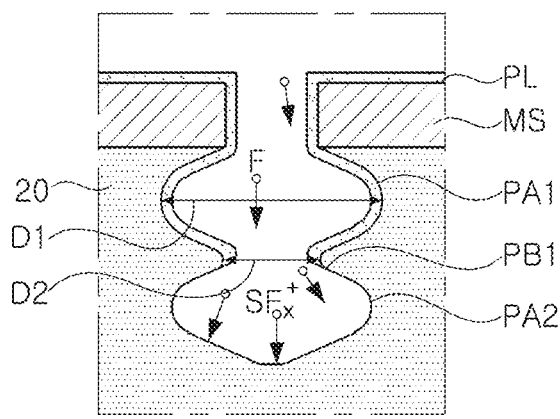

FIGS. 9A to 9C are main cross-sectional diagrams illustrating processes of a method of forming a hole-based distributed Bragg reflector layer. The processes illustrated in FIGS. 9A to 9C are an example of a Bosch process used in a method for forming a distributed Bragg reflector layer.

Referring to FIG. 9A, a first recess PA1 may be formed in the semiconductor layer 20 using an etching process with a mask pattern MS. A plurality of openings may be arranged in the mask pattern MS to correspond to the arrangement of the plurality of holes (see FIG. 2). The etching process may be, for example, an isotropic etching process, where $SF_x$ (e.g., $SF_6$) gas may be used, and the semiconductor layer 20 may be etched using radicals of the gas as reactive species; thereby forming the first recess PA1 in an etched region. The degree of side etching may be adjusted, e.g., according to the etching time. The maximum width of the first recess PA1 may be a first width D1.

Referring to FIG. 9B, an insulating protective film PL may be formed after performing the etching process for a short period of time. In the process of forming the insulating protective film, by decomposing a gas such as $CF_x$ (e.g., $C_4F_8$) gas in plasma, the insulating protective film PL (e.g., including a CF polymer) may be formed on a side surface and a bottom surface of the etched region.

Thereafter, referring to FIG. 9C, the insulating protective film PL portion disposed on the bottom surface may be removed using an etching gas, such as $SF_x$ (e.g., $SF_6$) gas. The exposed semiconductor layer 20 may be isotropically etched, thereby forming the second recess PA2. The maximum width of the second recess PA2 may be the first width D1. The process of removing the protective film may be performed while a high bias is applied to the semiconductor layer 20. A protruding first convex portion PB1 may be disposed between the adjacent first and second recessed portions PA1 and PA2 by this process. The shortest width of the first convex portion PB1 may be defined as the second width D2.

By repeating the cycle in FIGS. 9A to 9C, as illustrated in FIG. 1, a hole H having a periodically changing width may be formed, and accordingly, the desired distributed Bragg reflector layer 20 may be formed in a region adjacent to the incident surface of the semiconductor layer SL.

Figure 10A:
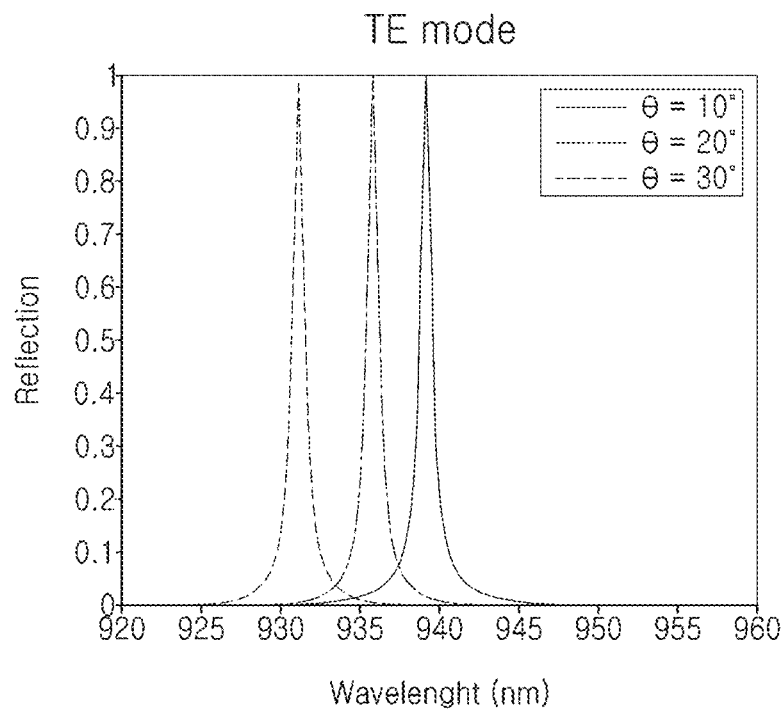
FIGS. 10A and 10B are graphs illustrating changes depending on incident angles of an absorption spectrum for TE polarized light and TM polarized light.
Figure 10B:
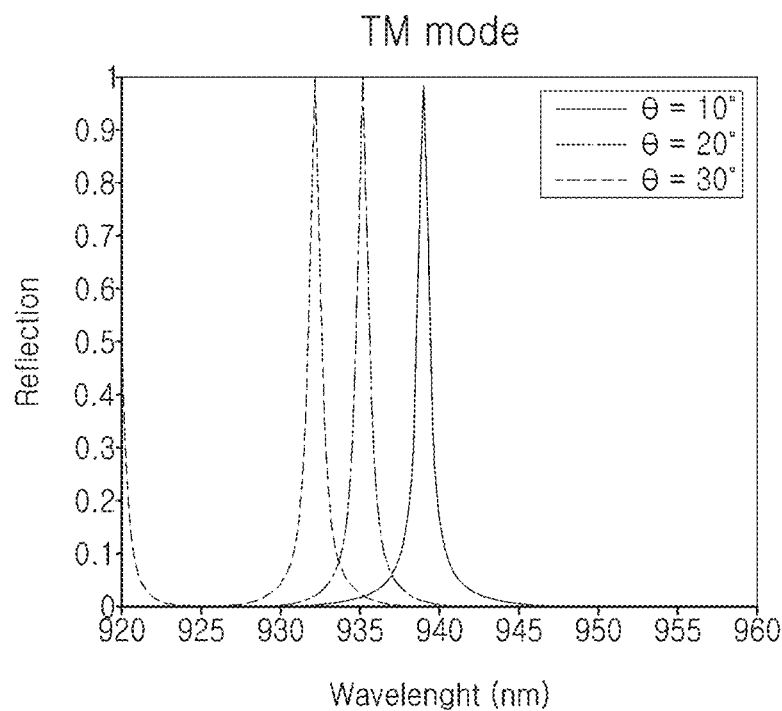

FIGS. 10A and 10B are graphs illustrating changes depending on incident angles of an absorption spectrum for TE polarized light and TM polarized light.

Referring to FIGS. 10A and 10B, the resonator-based light absorption structure 100 illustrated in FIGS. 1 and 2 may change by 0.98% in the TE mode by changing the incident angle to 10°, 20°, and 30°, and may change by 0.86% in the TM mode. As such, as for the resonator-based light absorption structure 100, changes in absorbance for an incident angle may be relatively insensitive.

Differently from the above example, it is known that a general photonic crystal and graphene-based perfect absorber may change by 1.05% (=Δf/f0×100) in the TE mode, and may change by 9.76% in the TM mode, which may be relatively large, with respect to an incident angle of 30°. As such, in the general absorber, as the resonant frequency changes as the incident angle changes, a wavelength band having a high absorbance may change, but in the resonator-based light absorption structure 100 in some of the example embodiments, changes in wavelength according to the incident angle may be insensitive.

This is, without being limited to a particular theory, because the resonator-based light absorption structure 100 according to the example embodiments may be based on a Fabry-Perot resonator (or a Fabry-Perot-like resonance) formed of a relatively high refractive index material (e.g., silicon).

Figure 11:
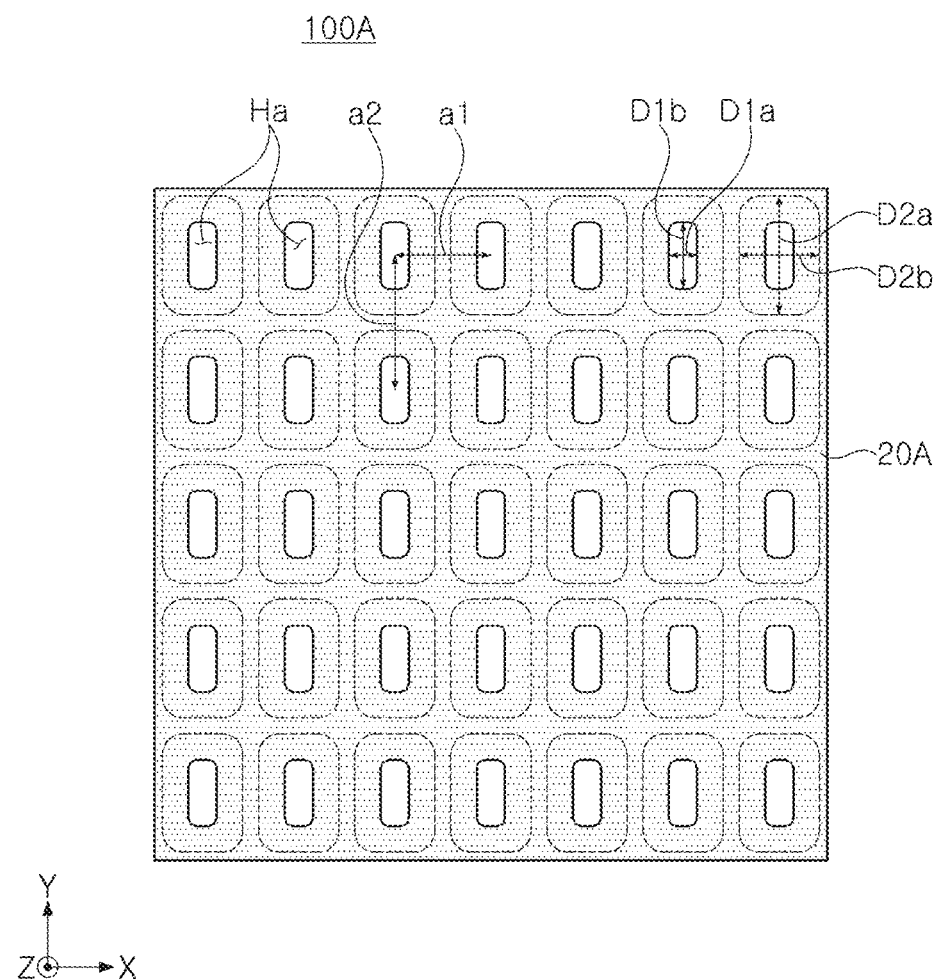
FIGS. 11 and 12 are plan diagrams illustrating various examples of a distributed Bragg reflector layer applicable to a light absorption structure.
Figure 12:
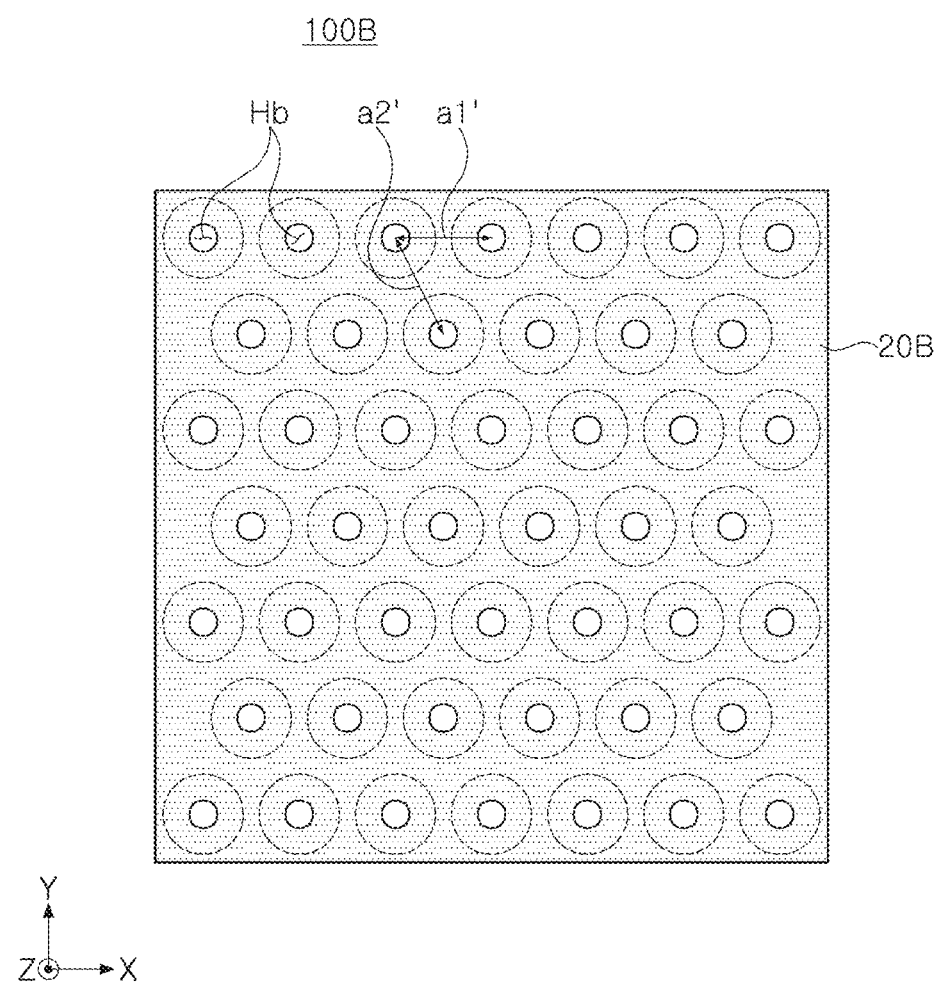

FIGS. 11 and 12 are plan diagrams illustrating various examples of a distributed Bragg reflector layer applicable to a light absorption structure.

Referring to FIG. 11, a light absorption structure 100A according to some example embodiments may have a structure similar to the light absorption structure 100 illustrated in FIGS. 1 and 2, other than the configuration in which a shape of a planar shape of the hole may be similar to a shape of a polygon (e.g., rectangle). Also, the components in the example embodiment may be understood from the descriptions of the same and/or similar components of the light absorption structure 100 illustrated in FIGS. 1 and 2 unless otherwise indicated.

Referring to FIG. 11, the light absorption structure 100A according to the example embodiment may have a structure similar to the light absorption structure 100 illustrated in FIGS. 1 and 2, other than the configuration in which a shape of a planar shape of the hole may be similar to a shape of a rectangle. Also, the components in the example embodiment may be understood from the descriptions of the same or similar components of the light absorption structure 100 illustrated in FIGS. 1 and 2 unless otherwise indicated.

In the DBR layer 20A in the example embodiment, a plurality of holes Ha having a substantially rectangular planar shape are arranged in the horizontal direction (e.g., the X direction and the Y direction). Also, the arrangement period a1 in the X direction may be different from the arrangement period a2 in the Y direction. For example, the arrangement period a1 in the X direction may be smaller than the arrangement period a2 in the Y direction. Each of the plurality of holes Ha may have a first short width D1a and a first long width D1b in a region having a narrow width, and may have a second short width D2a greater than the first short width D1a in a region having a wide width, and a second long width D2b greater than the first long width D1b.

The light absorption structure 100A according to some example embodiments may have polarization dependence due to the shape of the hole Ha. For example, light incident in the X direction and light incident in the Y direction may have different absorbance. Also, the shape of the hole Ha may be defined by the planar shape of the opening of the mask pattern MS illustrated in FIG. 9A.

Referring to FIG. 12, the light absorption structure 100B according to the example embodiment may have a structure similar to the light absorption structure 100 illustrated in FIGS. 1 and 2 (and/or the light absorption structure 100A illustrated in FIG. 11), other than the configuration in which the plurality of holes Hb may be hexagonally and densely arranged. The arrangement of plurality of holes Hb may also be referred to as hexagonally closed packed ("HCP") Also, the components in the example embodiment may be understood from the descriptions of the same or similar components of the light absorption structure 100 illustrated in FIGS. 1 and 2 unless otherwise indicated.

The DBR layer 20B in the example embodiment may have the plurality of holes Hb having a circular cross-sectional surface similarly to the example embodiments illustrated in FIGS. 1 and 2, but the holes may be hexagonally and densely arranged such that the holes may be densely arranged and a distance (a1'=a2') between the adjacent holes may be identical. The arrangement of the holes Hb may be defined by the arrangement of the openings of the mask pattern MS illustrated in FIG. 9A.

Figure 13:
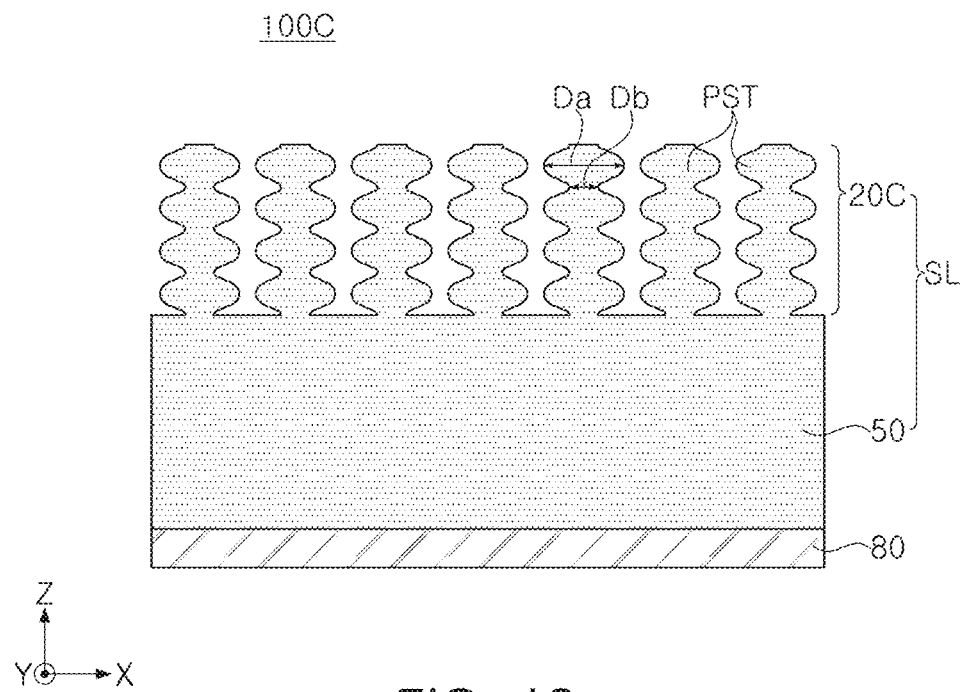
FIGS. 13 and 14 are cross-sectional diagrams illustrating a light absorption structure according to some example embodiments of the present disclosure.

FIG. 13 is a cross-sectional diagram illustrating a light absorption structure according to some example embodiments.

Referring to FIG. 13, a light absorption structure 100C according to some example embodiment may have a structure similar to the light absorption structure 100 illustrated in FIGS. 1 and 2, other than the configuration in which the DBR layer 20C may be implemented as a plurality of posts PST instead of a plurality of holes H. Also, the components in the example embodiment may be understood from the descriptions of the same or similar components of the light absorption structure 100 illustrated in FIGS. 1 and 2 unless otherwise indicated.

The distributed Bragg reflector layer 20C may have a plurality of posts PST having a width changing with a width change period in the thickness direction (e.g., Z direction) of the cavity layer 50 on the upper surface of the cavity layer 50. Similarly to the holes in the above example embodiments, the plurality of posts PST may have a width gradually changing from the first width Da to the second width Db with the width change period. The plurality of posts PST may have structures integrated with the cavity layer 50. For example, the plurality of posts PST may be structures obtained by patterning a region adjacent to the incident surface (e.g., an upper region) of the semiconductor layer SL.

The plurality of posts PST may be formed of a semiconductor material having a relatively high refractive index, and since an empty space around the plurality of posts PST is filled with a low refractive index medium (e.g., air), the effective refractive index may be changed in the thickness direction (e.g., Z direction) by the plurality of posts PST. For example, the region having the first width Da may have the first effective refractive index, but the region having the second width Db smaller than the first width Da may have a second effective refractive index smaller than the first effective refractive index due to the increased influence of the low refractive index medium. The plurality of posts PST disposed on the upper surface of the cavity layer 50 may be provided as the distributed Bragg reflector layer 20C using the changes in the effective refractive index.

The resonator-based light absorption structures 100, 100A, 100B, and 100C according to the above example embodiments may include a photoelectric conversion device implemented in the cavity layer 50.

In some example embodiments, since the cavity layer 50 includes a semiconductor, a photoelectric conversion device such as a photodiode may be easily formed. Also, the DBR layers 20, 20A, 20B, and 20C of the light absorption structures 100, 100A, and 100B may be not formed as insulating layers, and may be formed by patterning the upper region (the region adjacent to the incident plane) into a three-dimensional structure (a hole or a post) along with the cavity layer 50. As such, since the DBR layers 20, 20A, 20B, and 20C, which are reflective structures provided on one surface of the cavity layer 20, are also provided as a portion of the semiconductor layer SL, electrical connection with the photoelectric conversion device to be formed on the cavity layer 20 may be easily performed (see FIGS. 15 and 16). Hereinafter, in some example embodiments, the photoelectric conversion device implemented in the cavity layer 50 is also referred to as a "photoelectric conversion layer" or a "photoelectric conversion unit."

Figure 14:
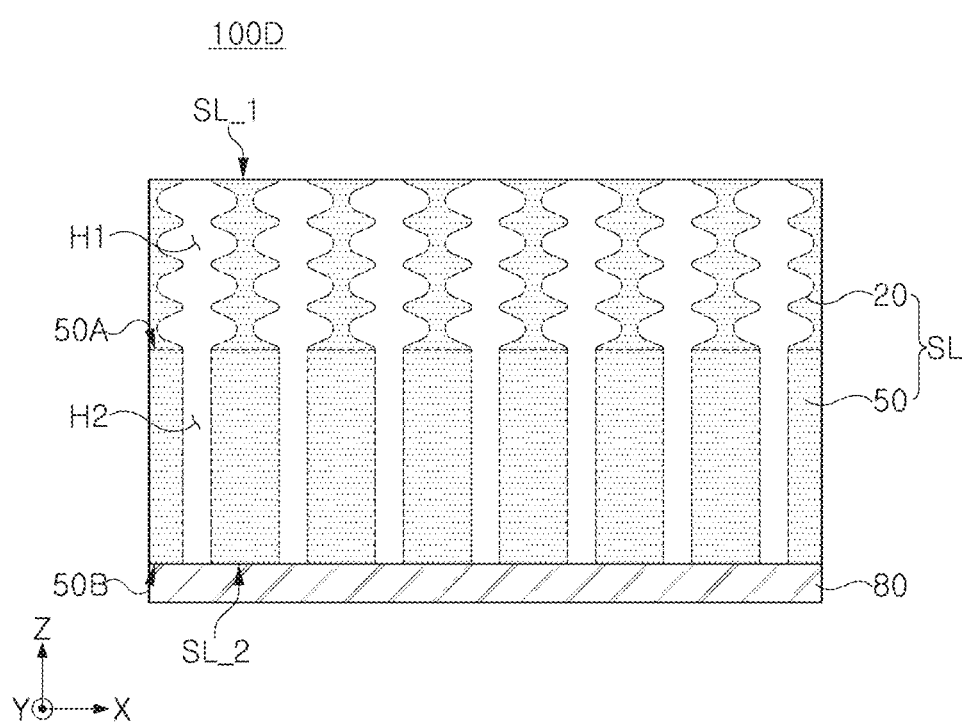

FIG. 14 is a cross-sectional diagram illustrating a light absorption structure according to an example embodiment.

Referring to FIG. 14, a light absorption structure 100D according to some example embodiments may have a structure similar to the light absorption structure 100 illustrated in FIGS. 1 and 2, other than the configuration in which the cavity layer may be patterned. Also, the components in the example embodiment may be understood from the descriptions of the same or similar components of the light absorption structure 100 illustrated in FIGS. 1 and 2 unless otherwise indicated.

The cavity layer 50 in the example embodiment may have hole patterns H2 arranged in positions corresponding to the holes H1 of the DBR layer 20, respectively. The hole patterns H2 of the cavity layer 50 may have a smaller width of the holes H1, which is the second width D2. The hole patterns H2 may be formed together in the process of forming the hole H1 without adversely affecting a resonance action.

The patterns formed in the cavity layer 50 are not limited to the illustrated hole patterns, and may have other various types of patterns. For example, the patterns of the cavity layer 50 may have a partially penetrated structure rather than a completely penetrated structure, and/or may be formed in an arrangement different from the arrangement of the holes H1 of the DBR layer 20.

Figure 15:
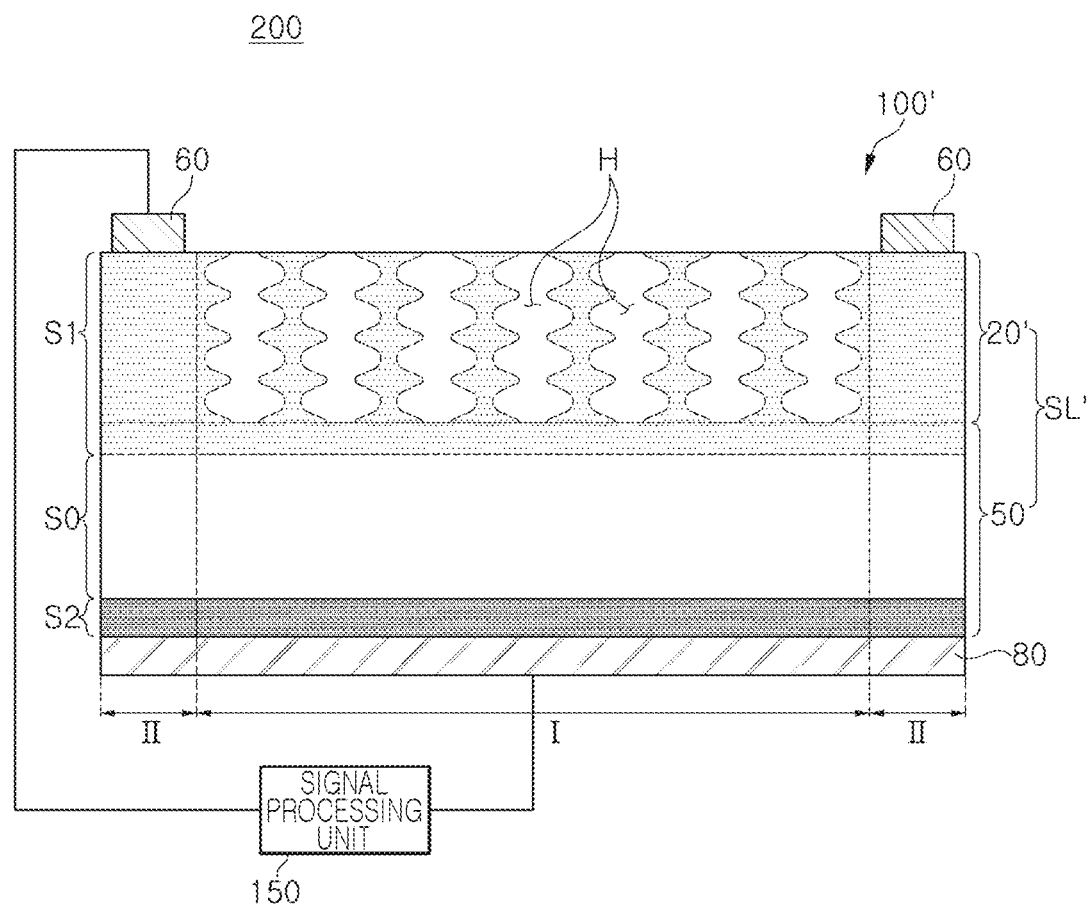
FIGS. 15 and 16 are cross-sectional diagrams illustrating a light sensing device according to some example embodiments of the present disclosure.
Figure 16:
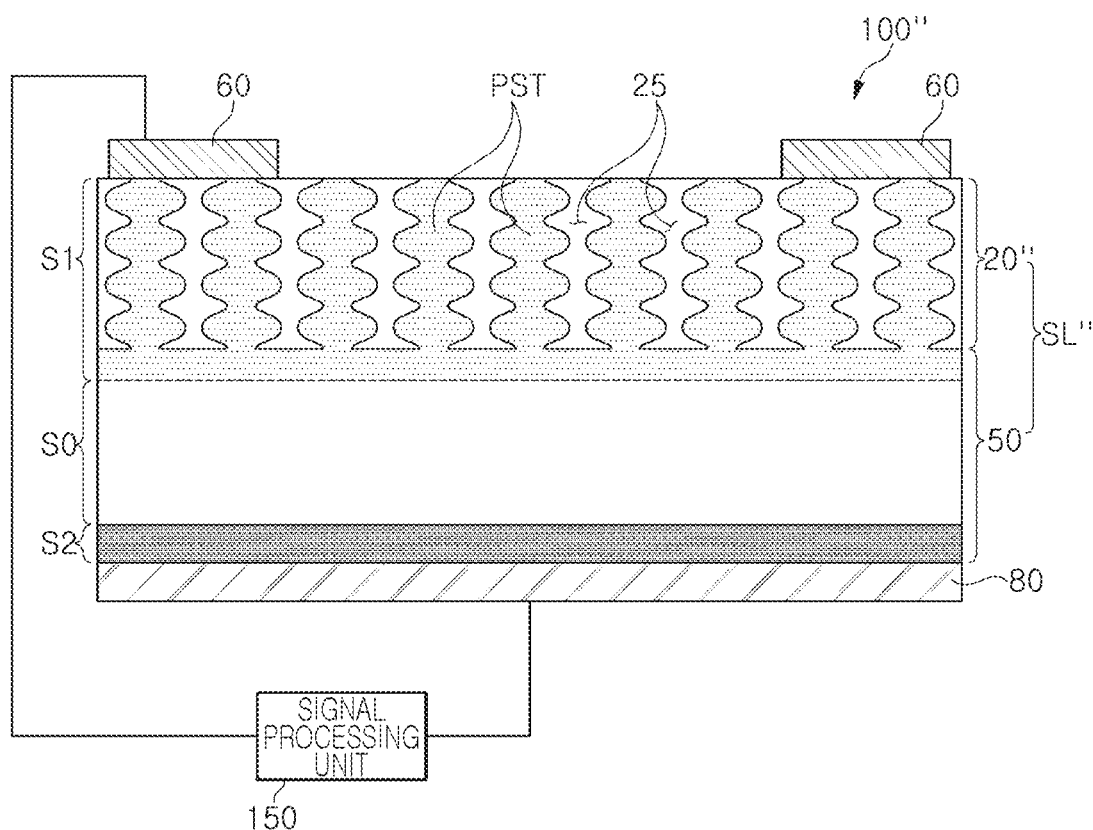

FIGS. 15 and 16 are cross-sectional diagrams illustrating a light sensing device according to some example embodiments.

Referring to FIG. 15, a light sensing device 200 may include a semiconductor layer SL' in which a distributed Bragg reflection layer 20' and a photoelectric conversion layer 50 are implemented, a first electrode 60 disposed on an upper surface of the SL' and a second electrode 80 disposed on a lower surface of the semiconductor layer SL'.

The semiconductor layer SL' in the example embodiment may include a sensing region I in which a plurality of holes H are arranged and a peripheral region II disposed around the sensing region I. The photoelectric conversion layer 50 may have a region overlapping at least the sensing region I in the vertical direction.

The distributed Bragg reflector layer 20' may be disposed in a region of the semiconductor layers SL' adjacent to the upper surface provided as a light incident surface, and the photoelectric conversion layer 50 may be disposed in a region of the semiconductor layers SL' adjacent to a lower surface. As described above, the distributed Bragg reflector layer 20' and the photoelectric conversion layer 50 may be arranged in order in a direction in which the light is incident. The photoelectric conversion layer 50 may correspond to the cavity layer 50 of the light absorption structure 100 according to the aforementioned example embodiment, and a photoelectric conversion device may be implemented therein.

The photoelectric conversion layer 50 may include a first conductivity type impurity region S1, a second conductivity type impurity region S2, and an intrinsic region S0 disposed therebetween. The intrinsic region S0 may be provided as a light receiving region and may be an undoped region or a region doped in a low concentration.

As illustrated in FIG. 15, the second electrode 80 may be connected to the second conductivity type impurity region S2 on the lower surface of the semiconductor layer SL'. The first conductivity type impurity region Si may be formed throughout a partial region of the photoelectric conversion layer 50 and the DBR layer 20', and the first electrode 60 may be disposed in a peripheral region II of the DBR layer 20' and may be connected to the first conductivity type impurity region S1. In other words, the DBR layer 20' may have the same impurity region as the first conductivity type impurity region S1 of the photoelectric conversion layer 50, and the first electrode 60 may be disposed on the upper surface of the semiconductor layer SL'.

As described above, the first and second electrodes 60 and 80 may be disposed on the upper and lower surfaces of the semiconductor layer SL', respectively, and may be electrically connected to the photoelectric conversion layer 50.

The second electrode 80 may be provided as a reflective layer including a metal reflective material. The second electrode 80 and the DBR layer 20', which are reflective layers, may form a resonator structure together with the photoelectric conversion layer 50 which is the cavity. As described above, by satisfying the matching condition by adjusting the parameters (e.g., the first and second widths, the width change period, and the number of repetitions) related to the DBR layer 20, the resonator structure may have complete and/or near complete absorbance or a high absorbance similar to perfect absorbance in a target wavelength (e.g., near-infrared wavelength).

The absorbed light in the target wavelength may be received in the intrinsic region S0 of the photoelectric conversion layer 50 and may generate photocharges, and the generated photocharges may be transmitted to a signal processing unit 150 through the first and second electrodes.

The signal processing unit 150 may generate an electrical signal corresponding to the received light based on the transmitted photocharges. In example embodiments, when the light sensing device 200 is applied as an image sensor, the signal processing unit 150 may include at least one of a row driver, a correlated double sampler (CDS), an analog-to-digital converter (ADC), and/or a timing controller. At least a portion of the components of the signal processing unit 150 may be implemented as a substrate (hereinafter, referred to as "logic substrate") having various logic circuits, and the logic substrate may be implemented to be combined with a light sensing device (see FIGS. 17 to 19).

The DBR layer 20' may have a plurality of holes H each having a width gradually changing in the thickness direction of the semiconductor layer SL' with a width change period. The light sensing device 200A according to another example embodiment may have a DBR layer 20" implemented using the post PST instead of the hole H.

For example, referring to FIG. 16, the light sensing device 200A according to some example embodiments may have a structure similar to the structure of the light sensing device 200 illustrated in FIG. 15, other than the configuration in which the DBR layer 20" may be implemented as the post PST and may not have a peripheral region. Also, the components in the example embodiment may be understood from the descriptions of the same or similar components of the light sensing device 200 illustrated in FIG. 15 unless otherwise indicated.

The plurality of posts PST may be structures obtained by patterning the upper region of the semiconductor layer SL", and may be integrated with the photoelectric conversion layer 50. The plurality of posts PST included in the DBR layer 20" may include the same semiconductor as that of the first conductivity type impurity region S1 of the photoelectric conversion layer 50. The first electrode 60 may be disposed on an upper surface of the DBR layer 20".

The light sensing device 200A according to the example embodiment may include a transparent resin layer 25 disposed on the upper surface of the photoelectric conversion layer 50 and surrounding the plurality of posts PST. The first electrode 60 may be disposed on the plurality of posts PST and the transparent resin layer 25. The first electrode 60 may be disposed in an edge region of the DBR layer 20". For example, the first electrode 60 may include a transparent electrode material, but the example embodiments thereof are not limited thereto.

Figure 17:
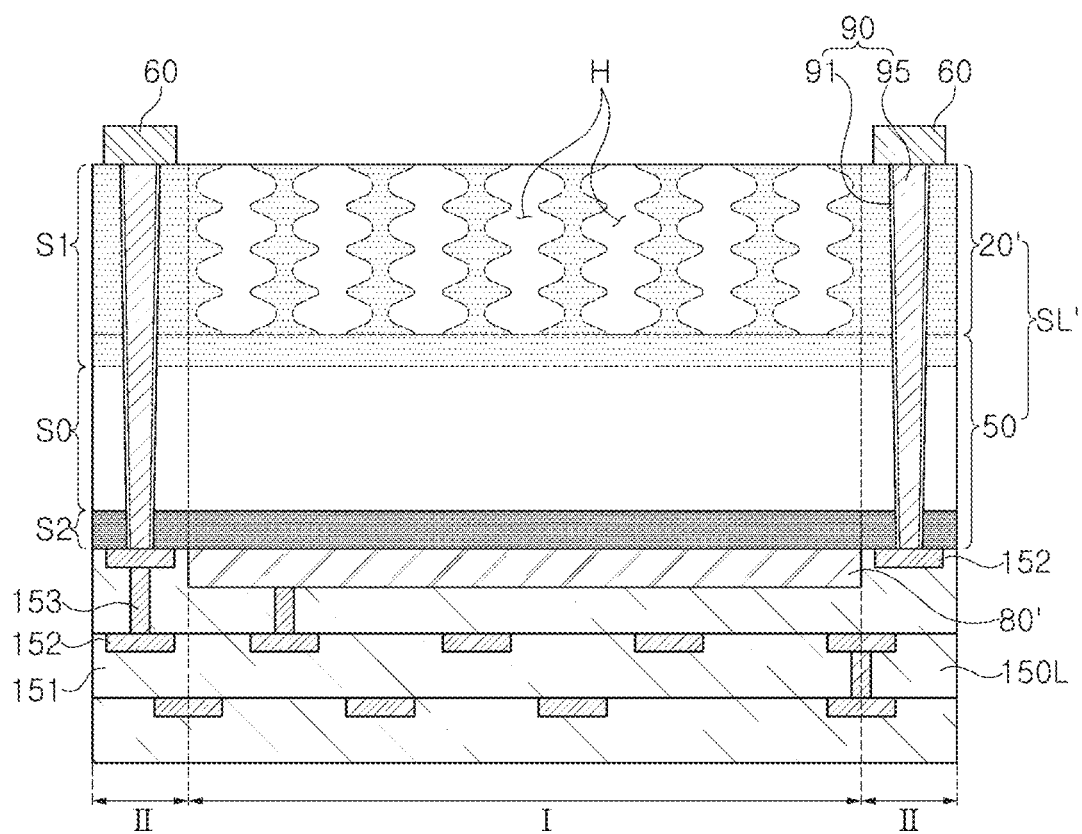
FIGS. 17 to 19 are cross-sectional diagrams illustrating a light sensing device according to some example embodiments of the present disclosure.
Figure 18:
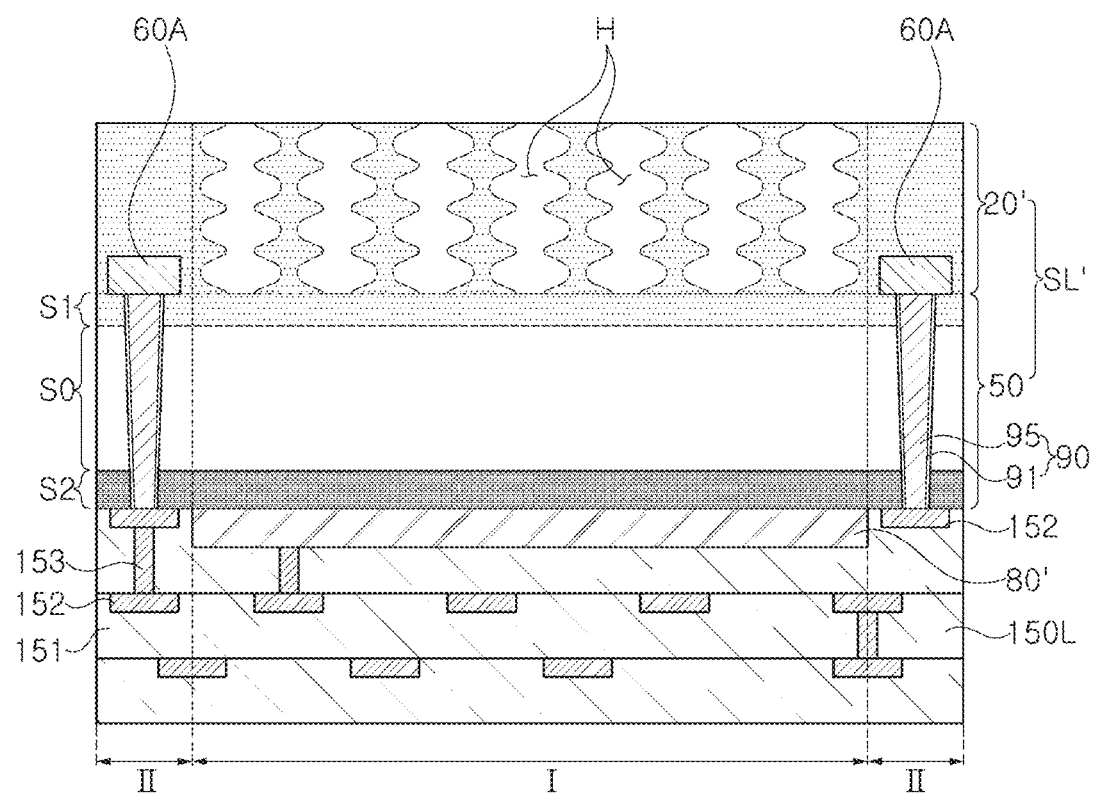
Figure 19:
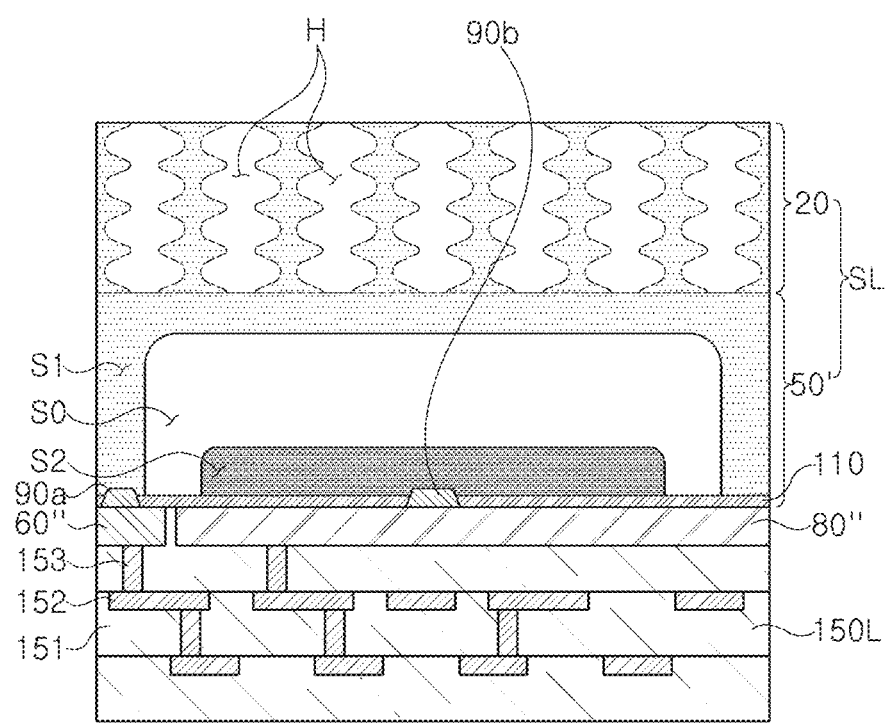

FIGS. 17 to 19 are cross-sectional diagrams illustrating a light sensing device according to some example embodiments.

Referring to FIG. 17, a light sensing device 200B may have a structure similar to the structure of the light sensing device 200 illustrated in FIG. 15, other than the configuration in which the logic substrate 150L may be disposed on a lower surface of the second electrode 80', and the first electrode 60 may be electrically connected to the logic board 150L by the through-via structure 90. Also, the components in the example embodiment may be understood from the descriptions of the same or similar components of the light sensing device 200 illustrated in FIG. 15 unless otherwise indicated.

The light sensing device 200B may include the logic substrate 150L disposed on the lower surface of the semiconductor layer SL' to cover the second electrode 80', which is a metal reflective layer. The logic substrate 150L may include a logic circuit electrically connected to the first and second electrodes 60 and 80' and configured to process a light signal output by the photoelectric conversion layer 50. The logic substrate 150L may include a wiring structure including a plurality of interlayer insulating layers 151 and a wiring pattern 152 and a wiring via 153 formed on the interlayer insulating layer 151.

The wiring structure of the logic board 150L may be connected to each of the first and second electrodes 60 and 80'. In some example embodiments, the through-via structure 90 may penetrate the peripheral region II of the semiconductor layer SL' and connect the first electrode 60 to the wiring structure (e.g., the wiring pattern 152). In some example embodiments, the through-via structure 90 may include a conductive plug 95 and an insulating barrier 91 surrounding a sidewall of the conductive plug 95. The insulating barrier 91 may electrically insulate the through-via structure 90 and the photoelectric conversion layer 50.

Referring to FIG. 18, a light sensing device 200C according to some example embodiments may have a structure similar to that of the light sensing device 200B illustrated in FIG. 17, other than the configuration in which the first electrode 60 may be disposed on the photoelectric conversion layer 50, and the semiconductor portion for the DBR layer 20' may be formed to cover the first electrode 60. Also, the components in the example embodiment may be understood from the descriptions of the same or similar components of the light sensing device 200B illustrated in FIG. 17 unless otherwise indicated.

The first electrode 60 may be disposed on a first conductivity type impurity region S1 of a photoelectric conversion layer 50, and the DBR layer 20' may have a semiconductor portion regrown on the photoelectric conversion layer 50. In the example embodiment, the semiconductor portion of the DBR layer 20' is not limited to the first conductivity type region, and may have, for example, an undoped region.

The through-via structure 90 may penetrate a peripheral region II of the photoelectric conversion layer 50 and may connect the first electrode 60 to the wiring structure (e.g., the wiring pattern 152). A conductive plug 95 of the structure 90 may be electrically isolated by the photoelectric conversion layer 50 by an insulating barrier 91.

In the above-described example embodiments, the through-via structure 90 is illustrated as a structure for leading out the first electrode 60, but the first electrode 60 may be connected to an desired external circuit (e.g., a signal processing unit) using a connecting conductor such as a wire or other electrode pattern, instead of the through-via structure 90.

Referring to FIG. 19, a light sensing device 200D according to some example embodiments may have a structure similar to that of the light sensing device 200 illustrated in FIG. 15, other than the configuration in which the internal configuration of a photoelectric conversion layer 50' may be different, and first and second electrodes 60" and 80" may be disposed between the lower surface of the semiconductor layer SL and the logic substrate 150L without using the through-via structure 50. Also, the components in the example embodiments may be understood from the descriptions of the same or similar components of the light sensing device 200 illustrated in FIG. 15 unless otherwise indicated.

The semiconductor layer SL may be a first conductivity type substrate and/or a first conductivity type semiconductor layer S1, but the example embodiments are not limited thereto, and the semiconductor layer SL may be a substrate having a first impurity region. The photoelectric conversion layer 50' may be formed from the lower surface of the semiconductor layer SL and may include an intrinsic region well S0 and a second conductivity type impurity region S2 formed in the intrinsic region well S0.

The insulating film 110 may be disposed on the lower surface of the semiconductor layer SL. The insulating film 110 may be formed of an insulating material having light transmittance so as to not deteriorate a mirror function of the second electrode 80". In some example embodiments, the first electrode 60" may also be formed as a metal reflective layer similarly to the second electrode 80" and may function as a portion of a mirror.

In some example embodiments, the first electrode 60" and the second electrode 80" may be disposed on the insulating film 110. The first via 90a and the second via 90b may penetrate the insulating film 110, the first via 90a may connect the first electrode 90a to the first conductivity type substrate Si (or the first conductivity type impurity region), and the second via 90b may be connected to each of the second electrode 90a and the second conductivity type impurity region S2. As described above, since both the first electrode 60" and the second electrode 80" may be disposed on the lower surface of the semiconductor layer SL, the semiconductor layer SL may not include the peripheral region II, differently from the aforementioned example embodiments (FIGS. 17 and 18).

In some example embodiments, a signal processing device such as a transfer gate and a floating diffusion region may be disposed in a partial region of the photoelectric conversion layer 50 or 50'. Such a structure may be advantageously considered when the light sensing device in the example embodiment is implemented as a near-infrared image sensor.

According to the above example embodiments, by including the distributed Bragg reflector layer using a hole or a post having a width periodically changing in the thickness direction in a region adjacent to the first surface (the light incident surface) of the semiconductor layer, and the reflective layer on the second surface opposing the first surface, a resonator-based light absorption structure having almost perfect absorbance with respect to light in a long wavelength band (e.g., near-infrared and/or short wavelength infrared rays) may be provided. The light absorption structure may obtain almost perfect absorbance even with a relatively thin thickness.

Also, since one-side reflective layer (e.g., the DBR layer) and the cavity layer may be implemented together on a single semiconductor layer, and a photoelectric conversion region such as a photodiode may be formed in the cavity layer. Accordingly, the light absorption structure in the example embodiments may be easily implemented by various types of light sensing device structures in which electrical connection is available.

While the example embodiments have been illustrated and described above, it will be apparent to those skilled in the art that modifications and variations could be made without departing from the scope of the present disclosure as defined by the appended claims.

What is claimed is:

1. A resonator-based light absorption structure, comprising:
   a first semiconductor layer configured to be an optical cavity of the resonator;
   a distributed Bragg reflector layer including a plurality of holes on a first surface of the first semiconductor layer, each of the plurality of holes having, in a cross-sectional view, a width gradually changing from a first width to a second width according to a width change period; and
   a reflective layer on a second surface of the first semiconductor layer, the second surface of the first semiconductor layer opposite to the first surface of the first semiconductor layer,
   wherein the width change period extends parallel to a direction extending from the first surface of the first semiconductor layer towards the second surface of the first semiconductor layer.

2. The resonator-based light absorption structure of claim 1, wherein the first semiconductor layer and the distributed Bragg reflector layer are, respectively, an upper region and a lower region of a single semiconductor layer.

3. The resonator-based light absorption structure of claim 2, wherein the single semiconductor layer includes at least one of silicon (Si), germanium (Ge), silicon germanium (SiGe), gallium arsenide (GaAs), or indium gallium arsenide (InGaAs).

4. The resonator-based light absorption structure of claim 1, wherein the resonator-based light absorption structure is configured to absorb light in at least one of a near-infrared band or in a short-wave infrared band.

5. The resonator-based light absorption structure of claim 4,
   wherein the first semiconductor layer includes silicon, and
   wherein the first width is in a range of 20-800 nm, the second width is in a range of 100-1000 nm, and the width change period is in a range of 50-600 nm.

6. The resonator-based light absorption structure of claim 5, wherein, in the distributed Bragg reflector layer, the width change period is repeated 2 to 30 times in each of the plurality of holes.

7. The resonator-based light absorption structure of claim 5, wherein a hole arrangement period is in a range of 100 nm-700 nm.

8. The resonator-based light absorption structure of claim 4, wherein a thickness of the first semiconductor layer is in a range of 100 nm-500 nm.

9. The resonator-based light absorption structure of claim 1, wherein an absorbance of light in a wavelength of 940 nm is 99% or more.

10. The resonator-based light absorption structure of claim 1, wherein, in a plan view, each the plurality of holes is circular.

11. A light sensing device, comprising:
    a semiconductor layer including a distributed Bragg reflector including a first surface of the semiconductor layer, and a photoelectric conversion unit including a second surface of the semiconductor layer, and the distributed Bragg reflector has a plurality of holes each having, in a cross-sectional view, a width gradually changing from a first width to a second width according to a width change period;

a first electrode in one region of the semiconductor layer; and a second electrode on the second surface of the semiconductor layer and having a reflective metal, wherein the width change period extends parallel to a direction extending from the first surface of the semiconductor layer to the second surface of the semiconductor layer.

12. The light sensing device of claim 11, wherein the semiconductor layer includes:

a first conductivity type impurity region connected to the first electrode, and a second conductivity type impurity region adjacent to the second surface and connected to the second electrode.

13. The light sensing device of claim 11, wherein the semiconductor layer is a first conductivity type semiconductor layer, and the photoelectric conversion unit includes a second conductivity type impurity region adjacent to the second surface and an intrinsic region in contact with the second conductivity type impurity region.

14. The light sensing device of claim 13, further comprising:

an insulating film on the second surface of the semiconductor layer and having light transmittance, wherein the first electrode and the second electrode are on the insulating film, and wherein the first electrode includes a first via penetrating the insulating film and connecting to the first conductivity type semiconductor layer, and the second electrode includes a second via penetrating the insulating film and connecting to the second conductivity type impurity region.

15. The light sensing device of claim 11, wherein the light sensing device is configured to absorb light in a band of 700 nm-1000 nm.

16. The light sensing device of claim 11, wherein the light sensing device is configured to absorb light in a band of 1000 nm-3000 nm.

17. A light sensing device, comprising:

a semiconductor layer including a distributed Bragg reflector including a first surface of the semiconductor layer and a photoelectric conversion unit including a second surface of the semiconductor layer, and the distributed Bragg reflector has a plurality of holes each having, in a cross-sectional view, a width gradually changing from a first width to a second width according to a width change period;

a first electrode in one region of the semiconductor layer;

a second electrode on the second surface of the semiconductor layer and having a reflective metal; and a logic substrate including a logic circuit, the logic substrate on the second surface of the semiconductor layer and electrically connected to the first and second electrodes, the logic circuit configured to process a signal output by the photoelectric conversion unit, wherein the width change period extends parallel to a direction extending from the first surface of the semiconductor layer to the second surface of the semiconductor layer.

18. The light sensing device of claim 17, wherein the semiconductor layer includes a sensing region overlapping the plurality of holes, and a peripheral region around the sensing region, and wherein the photoelectric conversion unit includes a first conductivity type impurity region connected to the first electrode, and a second conductivity type impurity region adjacent to the second surface and connected to the second electrode.

19. The light sensing device of claim 18, further comprising:

a through-via structure penetrating the peripheral region of the semiconductor layer and electrically connecting the first electrode to the logic circuit of the logic substrate, wherein the second electrode is in a region of the second surface corresponding to the sensing region of the semiconductor layer.

20. The light sensing device of claim 19, wherein the first electrode is on the first conductivity type impurity region of the photoelectric conversion unit, and the distributed Bragg reflector includes a semiconductor grown on the photoelectric conversion unit.

\* \* \* \* \*